July 25, 1967 A. E. WOLFRAM 3,333,200
TRANSISTORIZED AUTODYNE CONVERTER AND AMPLIFIER CIRCUIT ARRANGEMENT
Filed Oct. 18, 1963
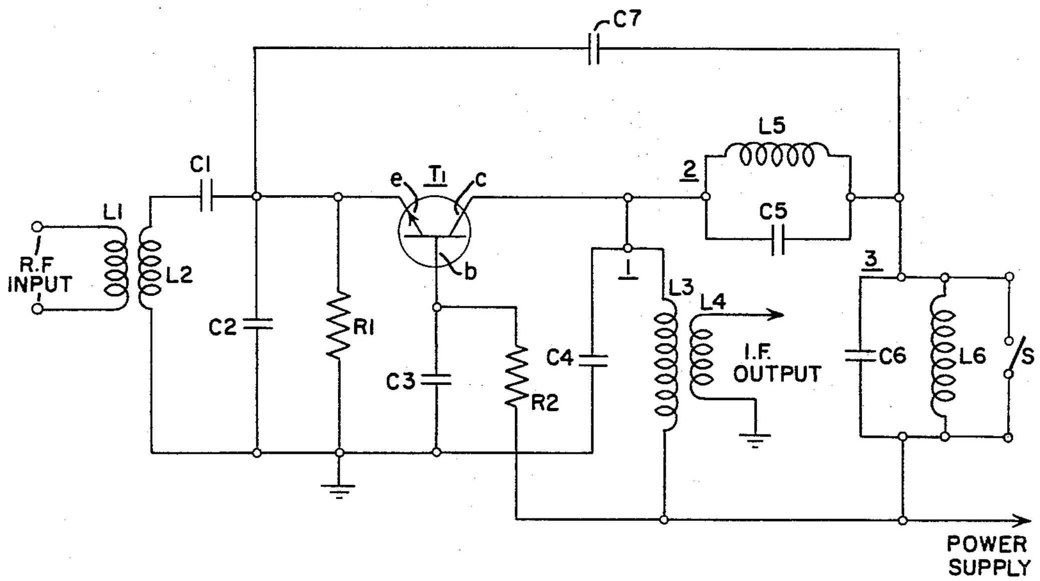
INVENTOR:
ADOLF E. WOLFRAM,
BY Frank J. Thompson
HIS ATTORNEY.

United States Patent Office 3,333,200
Patented July 25, 1967

3,333,200
TRANSISTORIZED AUTODYNE CONVERTER AND AMPLIFIER CIRCUIT ARRANGEMENT

Adolf Egmont Wolfram, Jamesville, N.Y., assignor to General Electric Company, a corporation of New York
Filed Oct. 18, 1963, Ser. No. 317,275
5 Claims. (Cl. 325—443)

The present invention relates to a transistorized self-oscillating frequency converter and more specifically to an improved converter suitable for wide band operation and which is easily transformable to operation as an amplifier.

It is known that a frequency converter employing a single transistor can simultaneously perform the functions of both an oscillator and a mixer. In such a converter, the transistor is provided with circuitry suitable to develop an oscillator signal which becomes mixed with an RF input signal because of the inherent nonlinearity of the transistor. The difference frequency signal which results from the mixing of the oscillator and RF input signals is applied to suitable IF circuitry from which an output is taken. When such a converter is utilized in a television tuner, it is desirable that tuning of the oscillator circuitry which is necessary to select various channels be possible over the full television band without causing appreciable detuning of the IF circuitry. It is also desirable that such a converter be easily transformable to operation as an IF amplifier when the tuner is serving to receive UHF channels, since the IF signal is supplied directly by a separate UHF converter during such operation.

Prior art transistor converters have not provided the necessary isolation between oscillator and IF circuitry to afford broad band operation, nor have they provided circuitry capable of being easily transformed to operation as an amplifier without necessitating excessive circuit changes.

Accordingly, an object of the present invention is to provide an improved transistor converter suitable for wide band operation.

Another object is to provide an improved transistor converter which allows oscillator frequency to be varied without causing appreciable detuning of the IF circuitry.

Still another object is to provide an improved transistor converter capable of being easily transformed to operate as an amplifier.

These and other objects are achieved in one embodiment of the invention through the use of a transistor having a plurality of parallel-resonant circuits coupled to its collector. First and second parallel-resonant circuits, tuned to the IF frequency, are coupled to the collector, the first resonant circuit serving to develop an output IF signal while the second resonant circuit serves to block the IF signal. A third parallel-resonant circuit or oscillator circuit, tuned to the oscillator frequency, is connected to the blocking circuit and thence to the collector. A regenerative feedback path from the junction between the oscillator and blocking resonant circuits to the emitter of the transistor causes the converter to oscillate at the frequency defined by the oscillator circuit. When the circuit arrangement operates as an autodyne converter the blocking circuit prevents oscillations at the IF frequency while when operating as an IF amplifier the blocking circuit inhibits regeneration at the IF frequency. The blocking circuit isolates the oscillator circuitry from the IF circuitry, thereby allowing the values of the elements in the oscillator circuit to be varied without causing appreciable detuning of the IF circuitry. The oscillator resonant circuit can be disabled so that the converter is transformed into an amplifier tuned to the IF frequency.

The novel and distinctive features of the invention are set forth in the appended claims. The invention itself together with further objects and advantages thereof may best be understood by reference to the following description and accompanying drawing in which:

The single figure is a schematic representation of a preferred embodiment of the improved transistor converter of the present invention.

Referring to the accompanying drawing, there is shown a transistor T1 comprising a collector *c*, base *b*, and an emitter *e*. Power is supplied to the transistor from a suitable power supply while resistances R1 and R2, connected to the emitter *e* and base *b* respectively, provide proper biasing in accordance with known techniques. An RF input signal is applied across inductance L1 which is coupled to inductance L2 in the emitter circuit of transistor T1. The inductance L2 in conjunction with capacitor C1 presents a tunable series-resonant circuit in the emitter circuit. The series-resonant circuit is tuned to resonance at the frequency of the RF input, the tuning of the resonant circuit being changed by substituting different values of inductance for L2. A capacitor C2 is in effect connected between the emitter *e* and base *b* of transistor T1 since the capacitor C3 connected between the base *b* and ground is effectively a short circuit.

A parallel-resonant circuit 1 comprised of inductance L3 and capacitance C4 is connected directly to the collector *c* of transistor T1. Resonant circuit 1 is fixed tuned to the IF frequency and the inductance L3 is coupled to inductance L4 to provide an IF output. A second parallel-resonant circuit 2 comprised of inductance L5 and capacitance C5 is also connected directly to the collector *c*, the circuit 2 being fixed tuned to the IF frequency. A third parallel-resonant circuit 3 comprised of inductance L6 and capacitance C6 is connected to the collector *c* through the parallel-resonant circuit 2. The circuit 3 is tuned to the oscillator frequency which may be varied by changing the inductance L6. Capacitor C7 is connected between the emitter *e* and the junction between resonant circuits 2 and 3 to provide a regenerative feedback path.

In the converter as described, the operation is such that the capactior C2 in the input end serves a dual function. This capacitor in conjunction with capacitor C7 serves as a voltage divider for the regenerative feedback signal. Capacitor C2 also serves to transform the relatively high resistive component of the dynamic parallel input impedance of the transistor into a low resistance component of the equivalent series impedance, and the capacitor C2, in combination with the series resonant circuit comprised of capacitance C1 and inductance L2 and the dynamic input impedance of the transistor, tends to maintain a constant bandwidth.

The operation of the parallel-resonant circuits in the output end of the converter is such that the circuit 3 serves to develop an oscillator signal. The oscillator signal is mixed with the RF input signal because of the inherent non-linearity of the transistor T1 to thereby produce a difference frequency IF signal which is developed across circuit 1. The parallel-resonant circuit 2 serves to isolate the circuits 1 and 3 to thereby prevent changes in inductance L6 which are necessary to tune the converter, from affecting the tuning of the resonant circuit 1. The capacitors C4, C5, and C6 also serve to minimize frequency variations of the converter which result from changes in base-collector capacitance of the transistor, since these capacitors are large in comparison with the base-collector capacitance so that variations thereof have little effect.

The parallel resonant circuit 2 which is tuned to the IF frequency serves to block the IF signal from the feedback path so that only the oscillator frequency signal is fed back to the emitter. Thus, oscillations at the IF frequency are suppressed and because the feedback is regenerative rather than degenerative, optimum gain is realized.

The converter as described can easily be converted to operation as an IF amplifier in the instance where an IF signal is supplied directly to the converter. Such transformation can be effected by disabling the parallel resonant circuit 3. The disabling can be either by shorting, for example, by closing switch S connected across the inductance L6, or removing the inductance from the circuit. When L6 is disabled, an oscillator signal will not be developed and thus there will be no feedback to the emitter, and the circuit will serve as an amplifier, which is tuned to the IF frequency by the parallel resonant circuit 1.

Although the invention has been described with respect to certain specific embodiments, it will be appreciated that modifications and changes may be made by those skilled in the art without departing from the spirit of the invention. Therefore, it is intended by the appended claims to cover all such modifications and changes that fall within the true spirit and scope of the invention.

What I claim is:

1. A converter for mixing an input signal of a first frequency with an oscillator signal of a second frequency and developing a resultant output signal of a third frequency comprising:

(1) a transistor having base, emitter, and collector electrodes, (2) input means for applying a signal of said first frequency to said emitter, (3) oscillator frequency-determining means connected to said collector for developing a signal of said second frequency, (4) output means directly connected to said collector for developing a resultant output signal of said third frequency, (5) blocking means connected to said collector and connected between said oscillator frequency-determining means and said output means for blocking said resultant output signal and isolating said output means from said oscillator frequency-determining means, (a) said oscillator frequency-determining means being connected to said collector through said blocking means, and (6) regenerative feedback means connected between said emitter and said collector through said blocking means.

2. The converter as defined in claim 1 wherein:

(1) said oscillator frequency-determining means comprises a parallel resonant circuit which is resonant at said second frequency, and (2) said output means and said blocking means comprise parallel-resonant circuits which are resonant at said third frequency.

3. The converter as defined in claim 1 wherein means are provided to disable said oscillator frequency-determining means to transform said converter into an amplifier tuned to said third frequency.

4. The converter as defined in claim 1:

(1) wherein said oscillator frequency-determining means comprises a parallel-resonant circuit which is resonant at said second frequency, and (2) wherein means are provided to disable said parallel-resonant circuit to transform said converter into an amplifier tuned to said third frequency.

5. The converter as defined in claim 1:

(1) wherein said oscillator frequency-determining means comprises an inductance and capacitance connected in parallel, and (2) wherein means are provided to disable said inductance to transform said converter into an amplifier tuned to said third frequency.

References Cited

UNITED STATES PATENTS

| | | | |
|---|---|---|---|
| 2,593,349 | 4/1952 | Seright et al. | 325—443 X |
| 3,010,014 | 11/1961 | Tanimura et al. | 325—451 |
| 3,018,369 | 1/1962 | Holmes | 325—451 X |

KATHLEEN H. CLAFFY, *Primary Examiner.*

R. S. BELL, *Assistant Examiner.*